United States Patent
Le Rhun et al.

(10) Patent No.: US 11,504,958 B2
(45) Date of Patent: Nov. 22, 2022

(54) METHOD FOR TRANSFERRING AT LEAST ONE LAYER OF MATERIAL FROM A FIRST SUBSTRATE TO A SECOND SUBSTRATE

(71) Applicant: COMMISSARIAT A L'ENERGIE ATOMIQUE ET AUX ENERGIES ALTERNATIVES, Paris (FR)

(72) Inventors: Gwenaël Le Rhun, Grenoble (FR); Christel Dieppedale, Grenoble (FR); Stéphane Fanget, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 17/254,077

(22) PCT Filed: Jun. 19, 2019

(86) PCT No.: PCT/FR2019/051503
§ 371 (c)(1),
(2) Date: Dec. 18, 2020

(87) PCT Pub. No.: WO2019/243744
PCT Pub. Date: Dec. 26, 2019

(65) Prior Publication Data
US 2021/0260859 A1 Aug. 26, 2021

(30) Foreign Application Priority Data
Jun. 22, 2018 (FR) ........................ 1855594

(51) Int. Cl.
*B32B 37/00* (2006.01)
*H01L 21/78* (2006.01)
*H01L 41/187* (2006.01)

(52) U.S. Cl.
CPC ........ *B32B 37/025* (2013.01); *H01L 21/7806* (2013.01); *B32B 2457/00* (2013.01); *H01L 41/1876* (2013.01)

(58) Field of Classification Search
CPC .............. B32B 37/025; B32B 2457/00; H01L 41/1876; H01L 41/313; H01L 21/02002; H01L 21/7806; H01L 41/0973
See application file for complete search history.

(56) References Cited

U.S. PATENT DOCUMENTS

2003/0064569 A1* 4/2003 Takayama ........... H01L 27/1214
438/455
2005/0282357 A1 12/2005 Takayama et al.
(Continued)

FOREIGN PATENT DOCUMENTS

| EP | 2 690 198 A2 | 1/2014 |
| JP | 2014-187094 A | 10/2014 |
| WO | WO 2017/018222 A1 | 2/2017 |

OTHER PUBLICATIONS

JP 2014187094; Inventor: Fumimasa Horikiri; Publication Oct. 2, 2014.*
(Continued)

*Primary Examiner* — Vishal I Patel
(74) *Attorney, Agent, or Firm* — Oblon, McClelland, Maier & Neustadt, L.L.P.

(57) ABSTRACT

The invention relates to a method for transferring at least one layer of material, comprising: producing first and second separating layers (108, 110), one against the other, on a first substrate (104); producing the layer to be transferred on the second separating layer (110); securing the layer to be transferred to a second substrate (106), forming a stack of different materials; and performing mechanical separation at the interface between the separating layers; in which the materials of the stack are such that the interface between the (Continued)

first and second separating layers has the weakest adhesion force, and the method comprises a step reducing an initial adhesion force of the interface between the first and second separating layers.

17 Claims, 12 Drawing Sheets

(56) References Cited

U.S. PATENT DOCUMENTS

2011/0204750 A1* 8/2011 Fujii .................... H01L 41/331
310/330
2014/0030857 A1 1/2014 Lee et al.

OTHER PUBLICATIONS

Machine Translation of WO 2017018222A1; Inventor: Takeshi Kijima; Publication: Feb. 2, 2017.*
International Search Report dated Oct. 15, 2019 in PCT/FR2019/051503 filed on Jun. 19, 2019, 2 pages.
French Preliminary Search Report dated Feb. 21, 2019 in French Application 1855594 filed on Jun. 22, 2018 (with English translation of Categories of Cited Documents), 2 pages.
Maszara, W. P. et al., "Bonding of silicon wafers for silicon-on-insulator," Journal of Applied Physics, vol. 64, 1988, pp. 4943-4950 (9 total pages).
U.S. Appl. No. 16/445,279, filed Jun. 19, 2019, US 2020/0013947 A1, Gwenael Le Rhun.
U.S. Appl. No. 16/445,274, filed Jun. 19, 2019, US 2020/0001327 A1, Gwenael Le Rhun.
U.S. Appl. No. 16/445,290, filed Jun. 19, 2019, US 2020/0013852 A1, Gwenael Le Rhun, et al.
U.S. Appl. No. 16/475,901, filed Jul. 3, 2019, US 2019/0344278 A1, Vincent Agache, et al.
U.S. Appl. No. 16/514,090, filed Jul. 17, 2019, US 2020/0025620 A1, Gwenael Le Rhun, et al.
U.S. Appl. No. 16/591,970, filed Oct. 3, 2019, US 2020/0109992 A1, Gwenael Le Rhun, et al.
U.S. Appl. No. 16/717,866, filed Dec. 17, 2019, US 2020/0203594 A1, Thierry Hilt, et al.
U.S. Appl. No. 16/848,896, filed Apr. 15, 2020, US 2020/0333547 A1, Laurent Mollard, et al.
U.S. Appl. No. 16/921,117, filed Jul. 6, 2020, Stephane Fanget, et al.

* cited by examiner

METHOD FOR TRANSFERRING AT LEAST ONE LAYER OF MATERIAL FROM A FIRST SUBSTRATE TO A SECOND SUBSTRATE

TECHNICAL FIELD AND PRIOR ART

The invention relates to a method for transferring at least one layer of material from a first substrate to a second substrate. In particular, the invention applies to the field of making MEMS (microelectromechanical system) and/or NEMS (nanoelectromechanical system) and/or microelectronic components, the method for transferring at least one layer being implemented during the production of such components. Advantageously, the invention applies to the production of piezoelectric and/or pyroelectric and/or ferroelectric transducers, or components comprising MIM (metal-insulator-metal) type and/or coplanar capacitors.

During the producing of MEMS and/or NEMS components, or microelectronic components, steps of depositing layers, thin or thick, on a substrate are implemented. The substrate whereon said layers are deposited may include a semiconductor, such as for example silicon, or glass, sapphire, or metal such as for example aluminum, or may correspond to a substrate comprising at least one polymer material.

However, in some cases, the temperature for depositing and/or annealing said layers is not compatible with the substrate whereon said layers are deposited. For example, when CMOS-type components are present on the substrate, the production of layers of materials on such a substrate must not involve the implementation of steps requiring a temperature higher than or equal to approximately 400° C. According to another example, such constraints may result from the presence of materials whereof the properties change with the thermal budget, for example due to a diffusion, or from the generation of stresses, occurring at the required deposition and/or annealing temperatures. According to another example, when the substrate used corresponds to a substrate comprising at least one polymer material, the temperatures for depositing and/or annealing layers on such a substrate must not exceed approximately 150° C.

In order to solve this problem, various methods for transferring layers of materials from a donor substrate, whereon the layer or layers to be transferred are produced initially, to a receiver substrate have been developed. Given that the deposition and/or annealing steps required for producing said layer or layers are implemented before the transfer of the layer or layers to the receiver substrate, the material or materials of the receiver substrate and/or of the element or elements already present on the receiver substrate are not affected by the temperatures applied during the deposition and/or annealing of the layer or layers on the donor substrate.

One of these transfer methods consists of forming a cleavage interface by ionic implantation in the donor substrate. The donor substrate, whereon the layer or layers to be transferred have been produced, is subsequently secured to the receiver substrate. Separation of the two substrates is subsequently performed, at the cleavage interface formed in the donor substrate, by heat treatment. However, such a transfer method makes it possible to only transfer layers of relatively low thickness, at most approximately 1 micron of thickness. In addition, sometimes the steps of ion implantation and of heat treatment having to be implemented are not compatible with the elements and/or materials present on one and/or the other of the substrates.

Another transfer method consists of forming the desired layer or layers on the donor substrate, subsequently transferring to the receiver substrate the assembly formed of the desired layer or layers and of the donor substrate, then etching the donor substrate from the rear face thereof (face opposite to that whereon the layer or layers to be transferred are located). The drawback of such a method is that the donor substrate is destroyed and that it cannot therefore be reused for producing another transfer of layer(s).

DESCRIPTION OF THE INVENTION

One aim of the present invention is to propose a method for transferring at least one layer of material from a first substrate to a second substrate not having the drawbacks of the transfer methods of the prior art, that is to say is not limited to the nature and the thickness of the layer or layers transferred, and that makes it possible to reuse the donor substrate whereon the layer or layers to be transferred are initially produced.

For this, the present invention proposes a method for transferring at least one layer of material from a first substrate to a second substrate, including at least:
producing first and second separating layers disposed one against the other on a face of the first substrate such that the first separating layer is disposed between the first substrate and the second separating layer;
producing said at least one layer of material to be transferred on the second separating layer;
securing said at least one layer of material to be transferred to the second substrate, forming a stack of different materials;
performing mechanical separation at an interface between the first and second separating layers, such that the first separating layer remains integral with the first substrate and that the second separating layer remains integral with said at least one layer of material to be transferred;
wherein the materials of the stack are chosen such that the interface between the first and second separating layers corresponds to the interface, of all of the interfaces of the stack, having the weakest adhesion force, and wherein the method includes, between the step of producing first and second separating layers and the step of securing, the implementation of at least one step reducing an initial adhesion force of the interface between the first and second separating layers.

The adhesion force at the interface between the first and second separating layers is reduced by implementing a specific step, such as for example the formation of cavities at said interface.

This method also has the advantage of being compatible with any thickness of layer(s), that is to say one or more thin and/or thick layers, to be transferred from one substrate to another.

In addition, at the end of the mechanical separation at the interface between the first and second separating layers, the first substrate is not destroyed and may be reused in order to implement a new transfer of at least one layer from the first substrate to another second substrate or to the same second substrate integrating the layer or layers previously transferred.

One of the first and second separating layers may include at least $SiO_2$ and/or silicon nitride (such as SiN and/or $Si_3N_4$), and the other of the first and second separating layers may include at least one noble metal.

The interface at which the mechanical separation is performed may be defined beforehand by a wise choice of the materials of the first and second separating layers naturally generating a weak adhesion force at said interface. By using on one side a noble metal and on the other SiO$_2$ and/or silicon nitride to form the first and second separating layers, a weak adhesion force is obtained at the interface of said two separating layers, without having to implement specific steps. Thus, after securing the two substrates with one another, the mechanical separation performed at the interface between the first and second separating layers does not degrade the other layers because it is the interface between the first and second separating layers that has the weakest adhesion force of all of the interfaces of the stack obtained by mutually securing the first and second substrates.

The use of a noble metal to form one of the first and second separating layers has the advantage of preventing an oxidation of said separating layer in contact with the other separating layer that includes SiO$_2$ and/or silicon nitride, in particular when the layer or layers of materials to be transferred are produced by involving significant thermal budgets, for example at temperatures higher than approximately 450° C., as is the case when one or more materials of perovskite crystal structure are deposited (PZT, BST, BCTZ, PMN-PT, KNN, NBT-BT, etc.).

The metal used to form one of the first and second separating layers may correspond to an oxidation-resistant metal.

Throughout the document, the term "on" is used without distinction of the orientation in space of the element to which this term relates. For example, in the feature "on a face of the first substrate", said face of the first substrate is not necessarily oriented upwards but may correspond to a face oriented according to any direction. Furthermore, the arrangement of a first element on a second element must be understood as being able to correspond to the arrangement of the first element directly against the second element, without any intermediate element between the first and second elements, or as being able to correspond to the arrangement of the first element on the second element with one or more intermediate elements disposed between the first and second elements.

The expression "all of the interfaces of the stack" designates all of the interfaces formed between two successive layers (disposed one directly against the other) of the stack.

The separating layer including SiO$_2$ and/or silicon nitride may correspond to a layer of SiO$_2$ or silicon nitride, or to a stack of SiO$_2$ and silicon nitride.

The noble metal corresponds to one or more of the following materials: platinum (Pt), gold (Au), silver (Ag), rhodium (Rh), osmium (Os), palladium (Pd), ruthenium (Ru), iridium (Ir).

When the noble metal is intended to be exposed to high thermal budgets, for example up to a temperature equal to approximately 850° C., said noble metal advantageously includes platinum and/or palladium. When the noble metal is intended to be exposed to lower temperatures, such as for example temperatures less than or equal to approximately 400° C., the other noble metals (Au, Ag, Rh, Os, Ru, Ir) may be used to form said noble metal layer.

The adhesion force of the interface between the first and second separating layers may be less than or equal to approximately 1.5 J/m$^2$, or preferably less than or equal to approximately 1 J/m$^2$. By way of example, the adhesion force between the first and second separating layers with one comprising SiO$_2$ and the other comprising platinum is equal to approximately 1 J/m$^2$.

The adhesion force between two layers of materials may be measured by the method known as blade insertion described for example in document W. P. Mazsara et al., "Bonding of silicon wafers for silicon-on-insulator", Journal of Applied Physics 64, p. 4943, 1988).

After the separation at the interface between the first and second separating layers, the free surface of the separating layer that includes the noble metal has a very low roughness. Therefore, it is not necessary to implement a polishing after implementing the mechanical separation step.

This method may apply to the transfer of any layer or stack of layers deposited on SiO$_2$ and/or silicon nitride (that of said one of the first and second separating layers) or on a noble metal (that of said other of the first and second separating layers).

The first substrate may include a semiconductor, for example silicon. The second substrate may include a semiconductor, for example silicon, or glass, sapphire, metal or a polymer metal.

Advantageously, the noble metal may include platinum.

Said at least one step reducing the initial adhesion force of the interface between the first and second separating layers may include the implementation of at least one heat treatment at a temperature modifying a stress of the noble metal. Such a heat treatment makes it possible to modify the stress of the noble metal, said change in stress enabling easier detachment during the implementation of the step of separating at the interface between the first and second separating layers. For example, when the noble metal includes or corresponds to platinum, the deposition of said metal generates a compressive stress in the metal deposited. The heat treatment that is implemented at a temperature for example higher than or equal to 250° C., or higher than or equal to 300° C., modifies said compressive stress that becomes a tensile stress.

The step of securing may be implemented:
  by means of an adhesive layer produced on said at least one layer of material to be transferred or on the second substrate, or
  by thermocompression between a first metal bonding layer, produced on said at least one layer of material to be transferred, and a second metal bonding layer produced on the second substrate, or
  by direct bonding, or molecular bonding, between a first bonding layer, produced on said at least one layer of material to be transferred, and a second bonding layer produced on the second substrate.

When the step of securing is implemented by means of the adhesive layer produced on said at least one layer of material to be transferred or on the second substrate, it is possible to have one or more other layers of materials present between the adhesive layer and said at least one layer of material to be transferred or between the adhesive layer and the second substrate. Furthermore, the adhesive layer may include at least one polymer-based adhesive.

When the step of securing is implemented by thermocompression between the first and second metal bonding layers, it is possible to have one or more other layers of materials present between the first metal bonding layer and said at least one layer of material to be transferred and/or between the second metal bonding layer and the second substrate. Furthermore, the first and second metal bonding layers may advantageously include copper and/or gold. The thermocompression may be implemented at a temperature less than or equal to approximately 400° C., or even less than approximately 150° C.

When the step of securing is implemented by direct bonding, or molecular bonding, between the first and second bonding layers, it is possible to have one or more other layers of materials present between the first bonding layer and said at least one layer of material to be transferred and/or between the second bonding layer and the second substrate.

Said at least one layer of material to be transferred may include at least one layer of pyroelectric and/or piezoelectric and/or ferroelectric and/or dielectric material. In such a configuration, the layer of pyroelectric and/or piezoelectric and/or ferroelectric and/or dielectric material that is transferred may be used to produce components, for example of MEMS and/or NEMS type, and such as piezoelectric actuators and/or sensors (or more generally any transducer), pyroelectric devices, vibration energy recovery devices, ferroelectric memories, high-density capacities, RF (radiofrequency) capacities, or LEDs. The stack thus transferred to the second substrate may be used to provide an electromechanical transduction stack. Alternatively, said at least one layer of material to be transferred may include at least one functional component such as at least one of those described above and produced before securing said at least one layer of material to be transferred (wherein said component or components are produced) to the second substrate.

The layer of pyroelectric and/or piezoelectric and/or ferroelectric and/or dielectric material may in particular be used to produce at least one MIM-type stack of a component produced from the layers of materials transferred to the second substrate. In this case, an electrically conductive layer, comprising for example gold, is advantageously present on the second substrate before the step of securing, which makes it possible to produce RF capacities having a significant quality factor.

This method is particularly advantageous when the pyroelectric and/or piezoelectric and/or ferroelectric and/or dielectric material includes lead, such as for example when said material corresponds to PZT (lead zirconate titanate) or a material of the same family as PZT, because in this case it makes it possible to overcome stresses related to the integration of said material including lead, such as the thermal budget required for the deposition thereof (which is not compatible with a substrate comprising CMOS components, or a glass substrate or also a substrate comprising a polymer). For example, when the pyroelectric and/or piezoelectric and/or ferroelectric and/or dielectric material corresponds to a perovskite crystal structure material such as for example PZT, the crystallization/densification of said material requires reaching temperatures higher than approximately 500° C., or even 700° C., which is not compatible with a substrate comprising CMOS components, or a glass substrate or also a polymer substrate.

Furthermore, it is possible to produce on the second substrate a layer of SiN that makes it possible to adjust a stress in a stack of a MEMS-type component and that must not be contaminated by lead diffused from the piezoelectric and/or pyroelectric and/or ferroelectric and/or dielectric material, at the risk of generating detachments during the deposition of said material. This also prevents the addition of layers used as diffusion barriers comprising for example $SiO_2$ and that complexify the final stack of materials (for example, $SiO_2$ makes the overall management of stresses more difficult due to the compressive stress thereof).

The method may be such that:
  the pyroelectric and/or piezoelectric and/or ferroelectric and/or dielectric material includes lead, and may correspond to PZT;
  said one of the first and second separating layers includes $SiO_2$;
  said at least one step reducing the initial adhesion force of the interface between the first and second separating layers includes the implementation of at least one heat treatment forming, at the interface between the first and second separating layers, an alloy of lead and $SiO_2$ in liquid phase, then of a cooling forming cavities at the interface between the first and second separating layers.

Such cavities contribute, alone or in complement to the materials chosen to form the first and second separating layers, to obtaining the weak adhesion force at the interface between the first and second separating layers.

Said at least one layer to be transferred may include at least one first electrode layer such that the layer of pyroelectric and/or piezoelectric and/or ferroelectric and/or dielectric material is disposed between the first electrode layer and the second separating layer. Said first electrode layer may advantageously be used to form the electrodes of the components subsequently produced from the layers transferred to the second substrate. Alternatively, when the step of securing includes a thermocompression between two metal bonding layers, said two metal bonding layers may be used as an electrode layer.

The second separating layer may include the noble metal. Thus, further to the role thereof for obtaining a weak adhesion force between the first and second separating layers, said second separating layer may be kept, after the step of mechanical separation, in order to be used as an electrode layer for the components subsequently produced from the layers transferred to the second substrate.

Said at least one layer of material to be transferred may include at least one second electrode layer disposed between the layer of pyroelectric and/or piezoelectric and/or ferroelectric and/or dielectric material and the second separating layer. Such a second electrode layer may be used to form the electrodes of the components subsequently produced from the layers transferred to the second substrate.

The first electrically conductive layer and/or the second electrically conductive layer may include at least one metal and/or at least one metal oxide. Alternatively, said at least one layer of material to be transferred may include at least one first layer of pyroelectric and/or piezoelectric and/or ferroelectric and/or dielectric material, and the method may further comprise, before the step of securing, the producing of at least one second layer of pyroelectric and/or piezoelectric and/or ferroelectric and/or dielectric material and of at least one third electrode layer disposed between the second substrate and the second layer of pyroelectric and/or piezoelectric and/or ferroelectric and/or dielectric material. This variant is advantageously implemented when the transfer method is used to produce transducer components performing both the actuator function and the sensor function.

The method may further comprise:
  before the step of securing, producing cavities in the second substrate, through a face of the second substrate whereon said at least one layer of material to be transferred is secured, and/or
  after the step of securing, producing cavities in the second substrate, through a face opposite to that whereon said at least one layer of material to be transferred is secured.

Such cavities may be used to form membranes of components from the layer or layers transferred to the second substrate, in particular for producing electromechanical transducer, in particular PMUT (Piezoelectric Micromachined Ultrasonic Transducer) type piezoelectric transducers or energy recovery devices. The second substrate may include at least one polymer material, and the step of securing may be implemented at a temperature less than or equal to approximately 150° C. Thus, thanks to the transfer of layers implemented after the producing thereof on the first substrate, the steps producing said layers on the first substrate are not limited by the maximum temperature supported by the polymer substrate. By way of non-limiting examples, securing at a temperature less than approximately 150° C. may correspond to bonding by thermocompression performed between two relatively thin metal layers, for example two layers of gold of thickness equal to approximately 50 nm, or bonding by means of an adhesive layer comprising a polymer material, or also oxide-oxide molecular bonding.

The method may further comprise, after the step of mechanical separation, a step of etching the second separating layer.

The method may further comprise, between the step of producing said at least one layer of material to be transferred and the step of securing said at least one layer of material to be transferred to the second substrate, a step of producing MEMS and/or NEMS and/or microelectronic type functional components from said at least one layer of material to be transferred.

After the step of mechanical separation, the preceding steps of the transfer method may each be repeated at least once in order to transfer at least one other layer of material from the first substrate to said at least one layer of material. The invention also relates to a method for producing MEMS and/or NEMS and/or microelectronic type components, comprising the implementation of a transfer method such as described above, then producing components from the second substrate and from said at least one layer of material to be transferred.

The components produced may be piezoelectric transducers and/or pyroelectric and/or ferroelectric components. In this case, the method implemented makes it possible to prevent a deep etching of the entire substrate by the rear face or a grinding of a SOI substrate. According to another possibility, the components produced may include MIM-type and/or coplanar capacitors.

BRIEF DESCRIPTION OF THE DRAWINGS

The present invention will be better understood upon reading the description of examples of embodiment given, purely by way of indicative and non-limiting example, while referring to the appended drawings wherein.

Identical, similar or equivalent portions of the various figures described hereafter bear the same numerical references so as to facilitate the passage from one Figure to the other.

The various portions shown in the figures are not necessarily according to a uniform scale, in order to make the Figures more readable.

The various possibilities (variants and embodiments) must be understood as not being exclusive from one another and may be mutually combined.

DETAILED DESCRIPTION OF SPECIFIC EMBODIMENTS

Reference is first of all made to FIGS. 1A to 1D that show the steps of a method for transferring at least one layer of material according to a first embodiment.

Figure 1A:
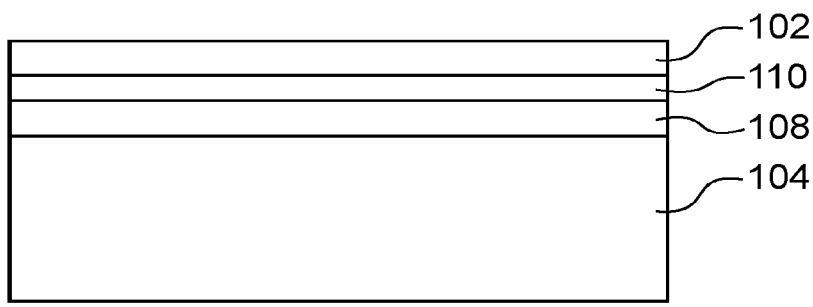
FIGS. 1A to 1D show the steps of a method for transferring at least one layer of material according to a first embodiment.
Figure 1B:
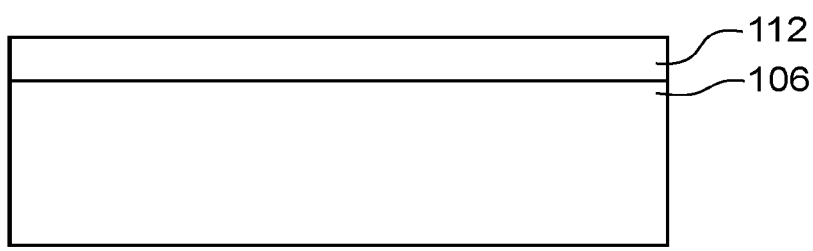
Figure 1C:
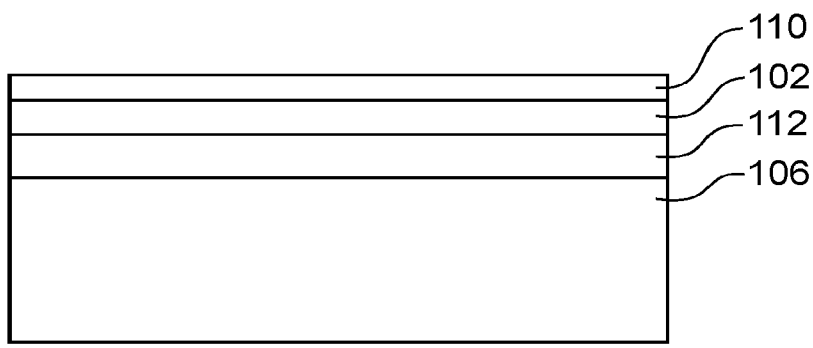

As shown in FIG. 1A, the reference 102 designates the layer or layers of materials intended to be transferred from a first substrate 104, also known as donor substrate and that corresponds to the substrate whereon the layer or layers 102 are initially produced, to a second substrate 106, also known as receiver substrate, shown on FIG. 1B.

The or each of the layers of materials to be transferred 102 may be thin or thick, and has for example a thickness between approximately 1 nm and 1 mm. The nature of the material or materials of said layer or layers 102 depends on the components intended to be produced from said layer or layers 102. This method may apply to the transfer of any type of material.

According to another example of embodiment, one or more microelectronic components such as transistors, light-emitting diodes, etc. may be produced, prior to the transfer of the layer or layers 102 to the second substrate 106, in the layer or layers 102.

The first substrate 104 corresponds here to a semiconductor substrate comprising for example silicon, and whereof the thickness is for example between approximately 100 µm and 1 mm.

The second substrate 106 includes at least one material corresponding for example to a semiconductor such as silicon, or glass, sapphire, metal or a polymer material. In the case of a second compliant/flexible substrate 106, it may be disposed on a rigid support during the transfer of the layer or layers thereon. The thickness of the second substrate 106 is for example equal to a plurality of hundreds of microns. When the second substrate 106 corresponds to a substrate made of polymer material, the thickness thereof is for example between approximately 1 µm and 1 mm.

An interface of weak adhesion force is formed between the layer or layers 102 and the first substrate 104. In this first embodiment, said interface is formed thanks to a first separating layer 108 here comprising at least $SiO_2$ and/or silicon nitride such as SiN and/or $Si_3N_4$, and a second separating layer 110 comprising at least one noble metal.

The interface of weak adhesion force corresponds to the interface between said two separating layers 108, 110, and is obtained thanks to the nature of the materials of the separating layers 108, 110 that only adhere weakly to one another. The material of the first separating layer 108 may advantageously correspond to $SiO_2$. The first separating layer 108 is for example carried out by thermal oxidation of the upper face of the first substrate 104. The thickness of the first separating layer 108 is for example between approximately 1 nm and 20 µm.

The noble metal of the second separating layer 110 includes at least one of the following elements: platinum, gold, silver, rhodium, osmium, palladium, ruthenium, iridium. The thickness of the second separating layer 110 is for example between approximately 1 nm and 200 nm.

In the first embodiment described here, an adhesive layer 112 is disposed on the second substrate 106. According to one particular example of embodiment, it is possible that the functional elements are present on the second substrate 106, for example electronic components. In this case, the adhesive layer 112 covers said functional elements. By way of example, the adhesive layer 112 may correspond to a layer of polymer adhesive or an adhesive dry film, whereof the thickness is for example between approximately 100 nm and 1 mm.

The assembly formed of the first substrate 104, of the separating layers 108, 110 and of the layer or layers 102 is secured on the second substrate 106 such that the layer or layers 102 are disposed against the adhesive layer 112, that is to say between the two substrates 104, 106. Within the stack thus obtained, the interface of weak adhesion force formed between the separating layers 108, 110 corresponds, of all of the interfaces of the stack, to the interface that has the weakest adhesion force between two successive layers of the stack.

Mechanical separation is subsequently performed at said interface of weak adhesion force between the separating layers 108, 110. Said mechanical separation is for example performed by introducing a blade between the two wafers. At the end of said mechanical separation, the stack remaining kept includes the second substrate 106 whereon the layer or layers 102 are secured by means of the adhesive layer 112. The second separating layer 110, which may be kept or removed after the step of separation, is disposed on the layer or layers 102 (see FIG. 1C).

Figure 1D:
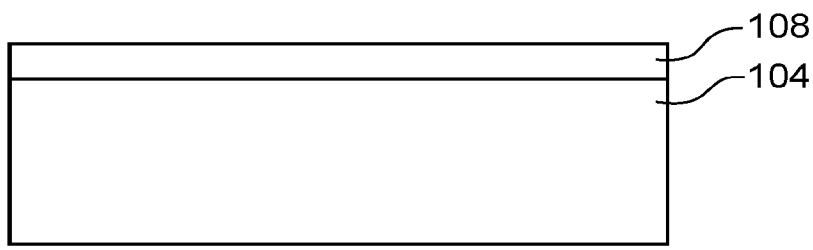

FIG. 1D shows the assembly formed of the first substrate 104 and of the first separating layer 108, separated from the other layers. Said first substrate 104 may be used to perform the transfer of one or more other layers 102 to another second substrate 106 or to the same substrate 106 already integrating one or more layers previously transferred.

In the first embodiment described in relation to FIGS. 1A to 1D, the first separating layer 108 includes $SiO_2$ and/or silicon nitride and the second separating layer 110 includes the noble metal. This may be advantageous when the material of the second separating layer 110 is subsequently used for producing components from the layers transferred to the second substrate 106. According to an alternative embodiment, it is however possible that the first separating layer 108 includes the noble metal and that the second separating layer 110 includes $SiO_2$ and/or silicon nitride.

In the first embodiment described above, the securing between the layer or layers 102 and the second substrate 106 is ensured by the adhesive layer 112. Alternatively, it is possible that said securing is carried out in another way. For example, it is possible to perform a direct bonding, or molecular bonding, between two bonding layers. Each of said two bonding layers has properties adapted to such a direct bonding: very low roughness, adapted material, etc. Said two bonding layers correspond for example to layers of $SiO_2$, of Si or also of SiN, and each include for example a thickness between 1 nm and 1 mm.

According to another example of embodiment, the securing between the layer or layers 102 and the second substrate 106 may be ensured by a thermocompression bonding. In this case, two metal bonding layers are produced, one on the layer or layers 102 and the other on the second substrate 106. Said metal bonding layers correspond for example to layers comprising copper or gold, and whereof the thickness is for example between 1 nm and 100 µm.

Any other bonding means may also be envisaged for carrying out the securing between the layer or layers 102 and the second substrate 106, from the moment that said securing does not form an interface having a weaker adhesion force than that formed between the separating layers 108, 110.

FIGS. 2A to 2D show the steps of a method for transferring at least one layer of material according to a second embodiment.

In said second embodiment, the element to be transferred from the first substrate 104 to the second substrate 106 corresponds to a stack of a plurality of layers intended to be used to produce piezoelectric and/or pyroelectric and/or ferroelectric and/or dielectric devices. Said stack of a plurality of layers to be transferred is formed on the first separating layer 108, and includes:

the second separating layer 110, which comprises for example platinum and whereof the thickness is for example equal to approximately 100 nm;

a layer 114 of piezoelectric and/or pyroelectric and/or ferroelectric and/or dielectric material, comprising for example PZT and/or AlN and/or KNN (($K_xNa_{1-x}$)$NbO_3$), and whereof the thickness is for example between approximately 1 nm and 100 µm and here equal to approximately 500 nm.

an optional grip layer 116, which comprises for example ruthenium and/or tungsten and/or chromium and/or titanium and/or $TiO_2$, and whereof the thickness is for example between approximately 0 nm and 10 nm;

an electrode layer 118, which includes an electrically conductive material, for example the same metal as that of the second separating layer 110, here platinum and/or ruthenium and/or iridium, and whereof the thickness is for example between approximately 1 nm and 500 nm and here equal to that of the second separating layer 110, that is to say approximately 100 nm.

The presence or not of the grip layer 116 in particular depends on the adhesion of the electrode layer 118 on the layer 114.

In said stack, the second separating layer 110 is configured to form, in the devices that will be produced from the stack of layers transferred to the second substrate 106, one of the electrodes that is located on one side of the portions from the layer 114 of each of the devices. The electrode layer 118, which is here metal, is intended to form the other of the two electrodes of said devices.

An optional layer 120 forming a diffusion barrier, comprising for example $RuO_2$ and/or Ni and/or TiN and/or WN and whereof the thickness is for example equal to approximately 60 nm or more generally between approximately 0 nm and 100 nm, is disposed on the electrode layer 118. The presence or not of the layer 120 depends on the thermal budget to which the stack is subjected after the transfer.

A first metal bonding layer 122, adapted for the implementation of a thermocompression bonding, is disposed on the barrier layer 120. The barrier layer 120 is configured to form a diffusion barrier between the electrode layer 118 and the first metal bonding layer 122 and prevent a possible diffusion (depending on the thermal budget applied) of the metal from the first metal bonding layer 122 in the electrode layer 118 during the securing with the second substrate 106.

As in the first embodiment, the first separating layer 108 includes $SiO_2$ and/or silicon nitride such as SiN and/or $Si_3N_4$, and has for example a thickness equal to approximately 500 nm. The interface of weak adhesion force is formed here, as in the first embodiment, between the first separating layer 108 and the second separating layer 110 due to the weak adhesion force obtained between the $SiO_2$ and/or the silicon nitride of the first separating layer 108 and the noble metal of the second separating layer 110.

Figure 2A:
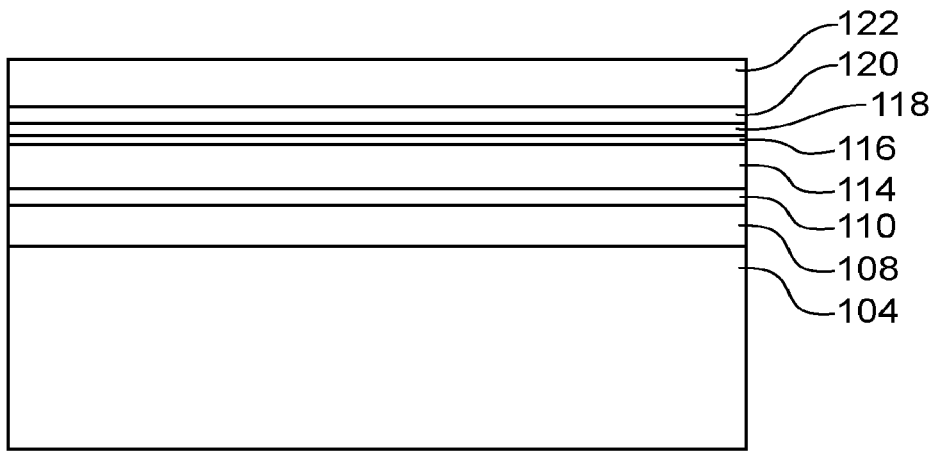
FIGS. 2A to 2D show the steps of a method for transferring at least one layer of material according to a second embodiment.

The stack shown in FIG. 2A is for example obtained by implementing the steps of:
  thermal oxidation of the first substrate 104, forming the first separating layer 108 at a front face of the first substrate 104;
  deoxidation (optional) of the rear face of the first substrate 104 (removing the oxide formed on the rear face of the first substrate 104 during the previous oxidation step);
  deposition, for example PVD (physical vapor deposition), of the noble metal of the second separating layer 110 on the first separating layer 108;
  deposition, for example by a sol-gel process, of the pyroelectric and/or piezoelectric and/or ferroelectric and/or dielectric material of the layer 114;
  successive depositions of the metals of the layers 116, 118, 120 and 122.

The stack obtained at the end of these steps is shown in FIG. 2A.

At the same time as the various layers previously described are produced on the first substrate 104, the second substrate 106 is also prepared for the transfer of the stack of layers 110, 114, 116, 118, 120, 122.

Figure 2B:
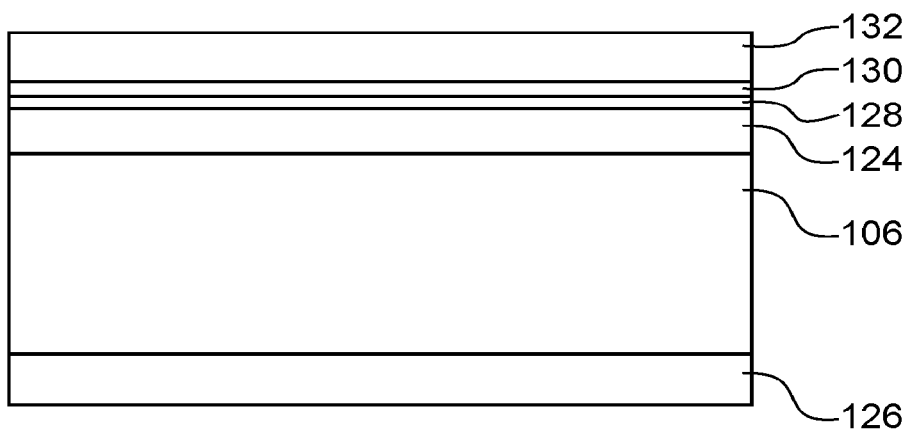

As shown in FIG. 2B, the second substrate 106 is covered, on the side of the front and rear faces thereof, with oxide layers 124, 126 for example each one similar to the first separating layer 108. In the example of embodiment described here, each of the oxide layers 124, 126 includes $SiO_2$ and a thickness for example equal to approximately 500 nm.

The oxide layer 124, which corresponds to that which is located on the side where the first substrate 104 is intended to be transferred, forms an electrically insulated layer between second substrate 106 and the other layers that are located on the layer 124. The insulating layer 124 is covered with a grip layer 128 including for example a metal such as titanium, chromium, tungsten or ruthenium, and whereof the thickness is for example equal to approximately 20 nm or more generally between approximately 1 nm and 100 nm. Another layer 130 is disposed on the layer 128 and includes for example nitride, here TiN and/or WN, and has a thickness equal to approximately 60 nm or more generally between approximately 1 nm and 100 nm.

Alternatively, it is possible that the oxide layer 124 is not present between the second substrate 106 and the grip layer 128. Indeed, it may be advantageous not to have $SiO_2$ in the stack forming a piezoelectric transducer in order to facilitate the management of stresses, because the compressive stress of $SiO_2$ may make the overall management of stresses in the piezoelectric structures more complex.

A second metal bonding layer 132 is disposed on the layer 130. Each of the first and second metal bonding layers 122, 132 includes a material, here a metal, adapted for the implementation of a thermocompression between said two layers. In the particular example of embodiment described here, the first and second metal bonding layers 122, 132 include copper and each have a thickness equal to approximately 500 nm. According to another example of embodiment, the first and second metal bonding layers 122, 132 may include gold, and may each have a thickness equal to approximately 50 nm.

The layer 130 forms here a diffusion barrier for preventing a diffusion of the metal of the second metal bonding layer 132 in the layers 128, 124 and in the second substrate 106. However, said layer 130 is optional.

In the example of embodiment described here, the rear face of the second substrate 106 is covered by the oxide layer 126. Alternatively, it is possible to eliminate said oxide layer 126 by carrying out a deoxidation of the rear face of the second substrate 106, as for the first substrate 104.

Figure 2C:
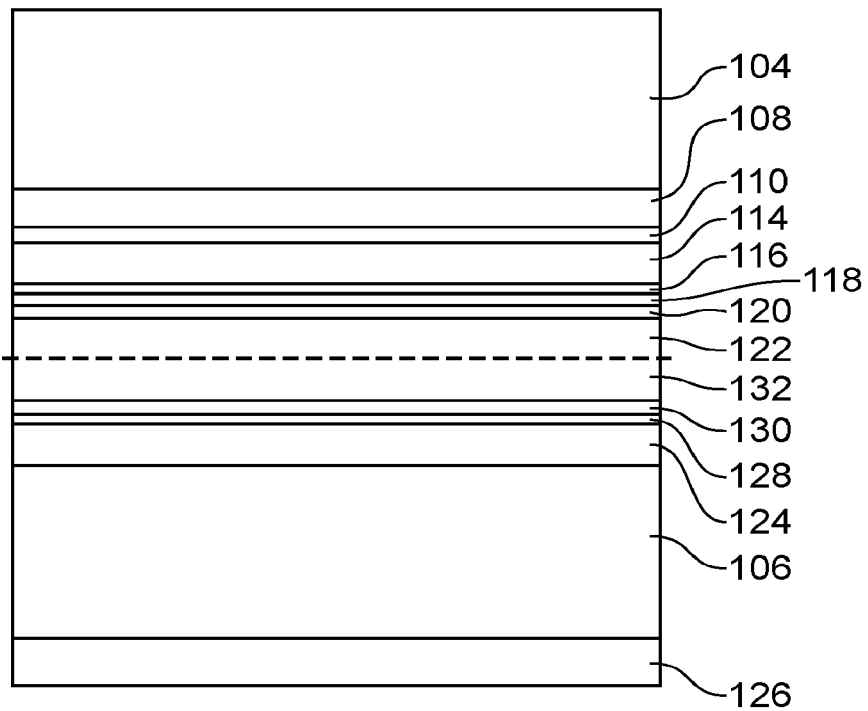
Figure 2D:
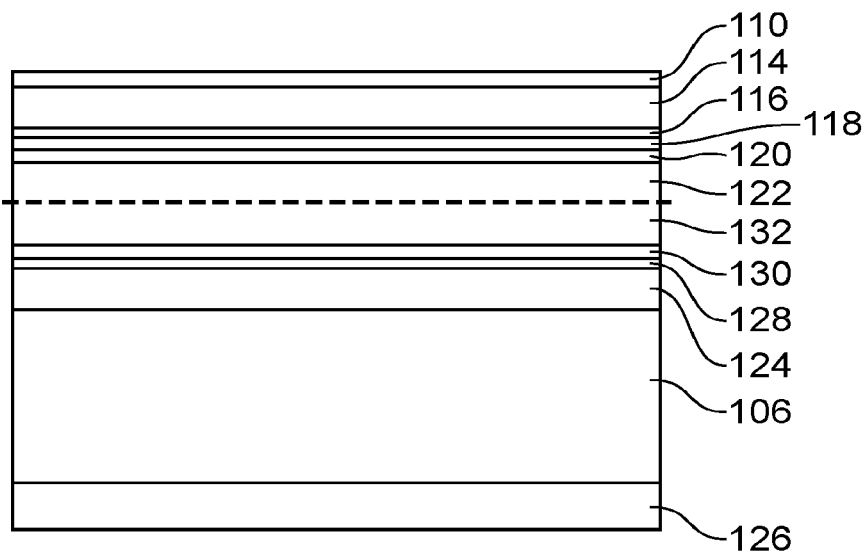

As shown in FIG. 2C, the first substrate 104 and the layers formed thereon are transferred to the second substrate 106 by performing a thermocompression bonding between the two metal bonding layers 122, 132. Said thermocompression bonding is for example implemented at a temperature between approximately 20° C. and 400° C., by applying a compressive force between approximately 1 kN and 50 kN, and during a duration between approximately 1 min and 30 min. The force and the duration with which the thermocompression bonding is implemented in particular depend on the thicknesses of the metal layers to be bonded. The parameters for implementing said thermocompression are adapted in particular depending on the properties of the metal bonding layers 122, 132.

Mechanical separation of two substrates 104, 106 is subsequently performed at the interface of weak adhesion force between the separating layers 108, 110, as in the first embodiment previously described. At the end of said mechanical separation, the stack remaining kept includes the second substrate 106, and the layers 124, 128, 130, 132, 122, 120, 118, 116, 114 and 110 disposed on the second substrate 106 (see FIG. 2D).

The first substrate 104 and the first separating layer 108 are thus separated from the other layers. Said first substrate 104 may be reused to carry out the transfer of other layers to another second substrate 106.

The various examples and variants previously described in relation to the first embodiment may apply to said second embodiment.

FIGS. 3A to 3D show the steps of a method for transferring at least one layer of material according to a third embodiment.

Figure 3A:
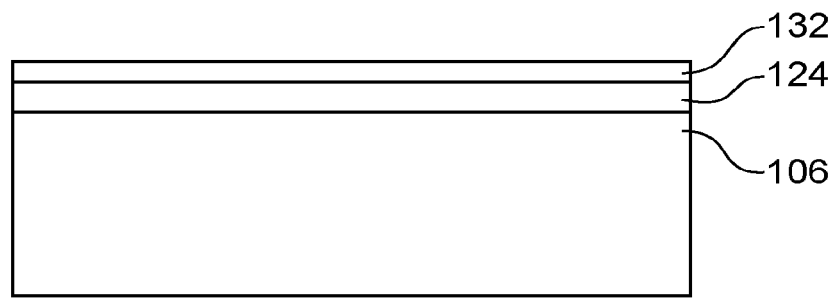
FIGS. 3A to 3D show the steps of a method for transferring at least one layer of material according to a third embodiment.

FIG. 3A shows the second substrate 106 whereon a plurality of layers will be transferred. The substrate 106 includes the front face thereof whereon is disposed the insulating layer 124. The second metal bonding layer 132, which corresponds here to a layer of gold of thickness equal to approximately 50 nm, is disposed on the insulating layer 124.

Figure 3B:
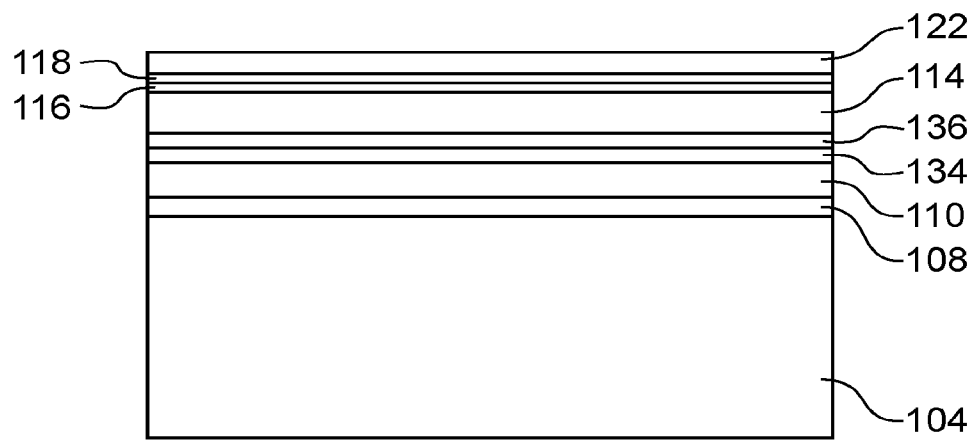

FIG. 3B shows the first substrate 104 that includes the layers to be transferred. The first separating layer 108, corresponding for example to a layer of platinum, is disposed on the front face of the first substrate 104. The second separating layer 110 is disposed on the first separating layer 108, and corresponds here to a layer of $SiO_2$.

The layers to be transferred to the second substrate 106 are disposed on the second separating layer 110. Said layers correspond to:
- a grip layer 134, comprising for example TiO$_2$, ensuring a good adhesion between the second separating layer 110 and an electrode layer 136 that here includes platinum and is intended to form a first electrode of the devices that will be produced from the layers transferred to the second substrate 106;
- the layer 114 of piezoelectric and/or pyroelectric and/or ferroelectric and/or dielectric material, which includes for example PZT
- the optional grip layer 116 and the electrode layer 118;
- the first metal bonding layer 122.

As in the second embodiment previously described, a thermocompression bonding is subsequently performed between the first and second metal bonding layers 122, 132.

Figure 3C:
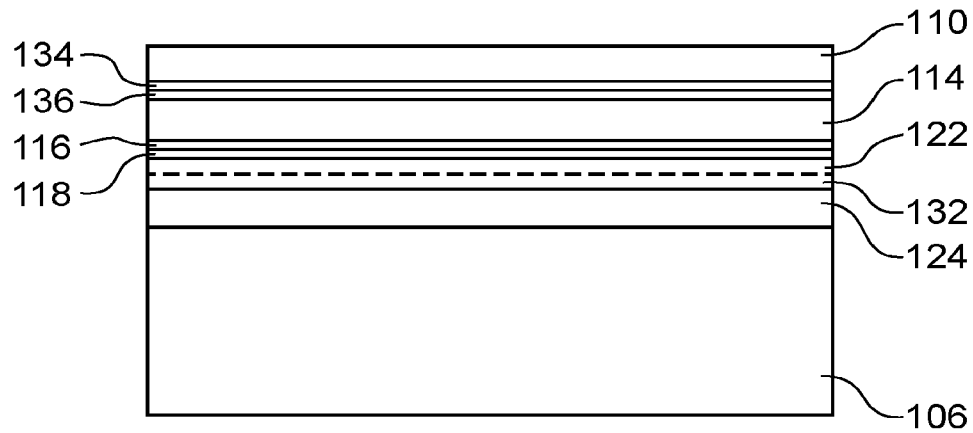
Figure 3D:
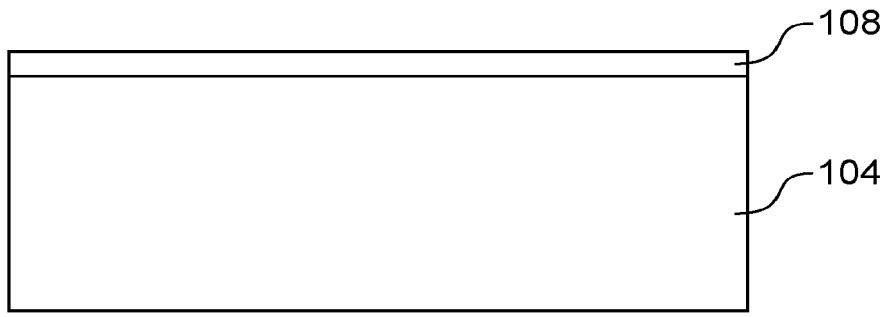

Mechanical separation is subsequently performed at the interface of weak adhesion force formed between the separating layers 108, 110 as in the previous embodiments. FIG. 3C shows the second substrate 106 whereon the various layers have been transferred, and FIG. 3D shows the first substrate 104 remaining whereon the first separating layer 108 is kept. The second separating layer 110 that is located at the top of the layers transferred to the second substrate 106 may be eliminated.

The various examples and alternative embodiments previously described in relation to the preceding embodiments may apply to said third embodiment.

In the three embodiments previously described, the interface of weak adhesion force is formed thanks to the intrinsic properties of the materials of the separating layers 108, 110, due to the fact that SiO$_2$ and/or silicon nitride and a noble metal adhere little to one another.

Alternatively, it is possible that the weak adhesion force of the interface between the donor substrate (first substrate 104) and the layer or layers to be transferred to the receiver substrate (second substrate 106) is obtained thanks to at least one specific step intentionally degrading the adhesion properties of said interface and reducing the adhesion force at said interface between the materials of the first and second separating layers 108, 110. By way of example, during the deposition of the layer 114 on the second separating layer 110, it is possible to implement a heat treatment diffusing lead atoms from the PZT of the layer 114 towards the SiO$_2$ of the first separating layer 108, through the second separating layer 110 that includes for example platinum. With such a heat treatment, for example implemented at a temperature higher than or equal to approximately 700° C., a SiO$_2$+Pb mixture in liquid phase forms at the interface between the first and second separating layers 108, 110. When the temperature lowers, cavities are then created at said interface, in the layer formed of the SiO$_2$ and lead mixture.

Figure 4:
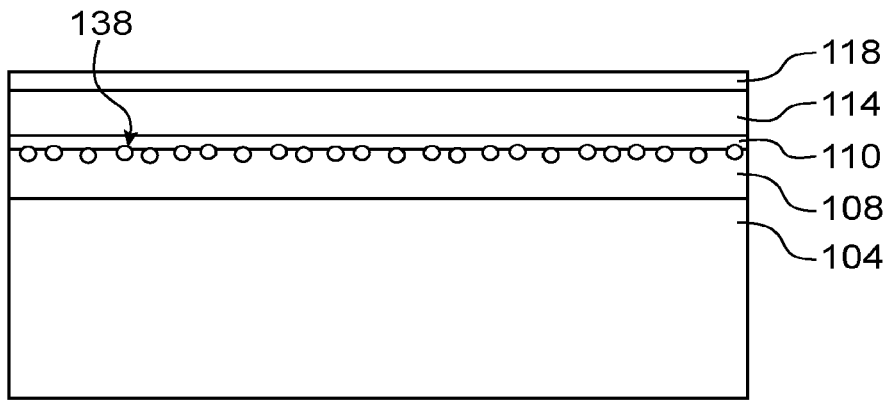
FIG. 4 shows a stack of materials formed during a method for transferring at least one layer of material according to a fourth embodiment.

FIG. 4 shows a structure obtained during the implementation of the method for transferring at least one layer according to a fourth embodiment. Said structure includes the first substrate 104 whereon are disposed the layers 108, 110, 114 and 118, and whereof the interface formed between the separating layers 108, 110 is degraded by cavities 138 created following the diffusion of lead from the PZT of the layer 114 in the SiO$_2$ of the first separating layer 108. Said cavities 138 reduce the adhesion between the separating layers 108, 110.

Said degradation, or reduction, of the adhesion force of the interface between the separating layers 108, 110 may therefore be obtained when the intrinsic properties of the materials used for said separating layers 108, 110 do not generate, without supplementary intervention, the formation of an interface of weak adhesion force.

Figure 5:
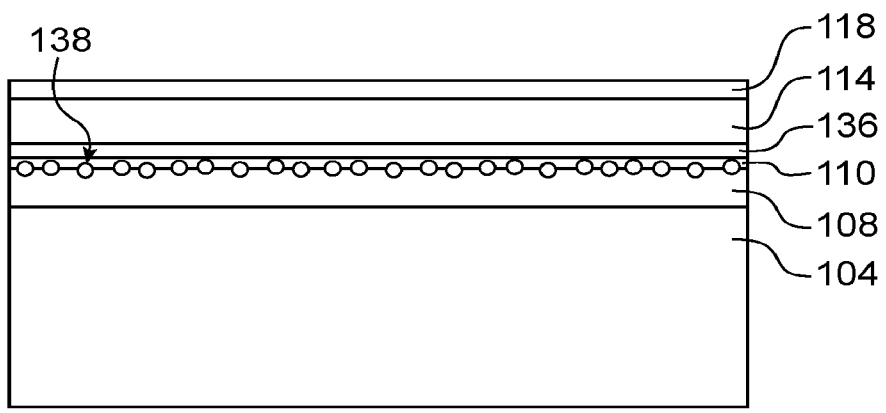
FIG. 5 shows a stack of materials formed during a method for transferring at least one layer of material according to one variant of the fourth embodiment.

FIG. 5 shows such a variant wherein the second separating layer 110 corresponds here to a layer of TiO$_2$. The thickness of said second separating layer 110 is for example equal to 20 nm. The reference 136 designates an electrode layer intended to form an electrode of components that will subsequently be produced, and that includes for example platinum. In this configuration, the adhesion force between the TiO$_2$ of the second separating layer 110 and the platinum of the electrode layer 136 as well as that between the SiO$_2$ of the first separating layer 108 and the TiO$_2$ of the second separating layer 110 are not weak in relation to that of the other interfaces of said stack. Thanks to the heat treatment implemented after the deposition of the layer 114, the diffusion of lead from the PZT of the layer 114 up to the interface between the separating layers 108, 110 and the formation of cavities 138 at said interface make it possible to give it a weak adhesion force. Alternatively, the second separating layer may include ZrO$_2$ or also ZnO or Ta$_2$O$_5$.

Said intentional degradation of the separating interface between the first and second substrates is implemented for all of the embodiments previously described.

Another possibility for degrading or reducing the adhesion force of the interface between the separating layers 108, 110 consists of implementing a heat treatment at a temperature modifying a stress of the noble metal of one of the two separating layers 108, 110. By considering the examples previously described where the second separating layer 110 includes a noble metal, and in particular platinum, which includes a compressive stress generated during the deposition thereof, the implementation of a heat treatment at a temperature for example higher than or equal to 250° C., or even higher than or equal to 300° C., modifies said stress that becomes a tensile stress. Said change in stress enables easier detachment during the implementation of the step of separating at the interface between the first and second separating layers 108, 110.

In the second and third embodiments previously described, the layer 114 advantageously includes a pyroelectric and/or piezoelectric and/or ferroelectric and/or dielectric material and is disposed between two layers of metal electrodes so that said stack of layers is subsequently etched in order to form piezoelectric and/or pyroelectric and/or ferroelectric and/or dielectric functional components produced from the layers transferred to the second substrate 106.

In the embodiments and examples of embodiment described, the second substrate 106 whereon at least one layer of material is transferred corresponds to an unstructured layer of material. Alternatively, it is possible that cavities are produced through at least one portion of the thickness of the second substrate 106, from the rear face of said second substrate 106, so that the layer or layers transferred can be used to form membranes of the devices produced from the layer or layers transferred.

In addition, it is possible that the layer of material transferred is structured and forms part of one or more functional components already produced before the transfer to the second substrate 106.

According to another variant, it is possible that the layers supplementary to those described in the preceding embodiments are present on the second substrate 106 before the securing thereof with the first substrate 104. For example, when the layer or layers transferred to the second substrate 106 are intended to be used for producing RF capacity type components, it is possible that one or more metal layers having a low resistivity (comprising for example gold) are present on the second substrate 106. This variant is particularly advantageous when the layers transferred to the second substrate 106 include a layer comprising a "high-k" dielectric material (or with high permittivity, for example higher than approximately 3.4, and because such a dielectric material is very complex to produce on a metal layer of low resistivity.

The transfer method described here may advantageously be used to produce components forming electromagnetic transducers integrating materials that will make it possible to produce actuator and/or sensor functions. The sensor function is obtained by direct piezoelectric effect (a mechanical stress generates the appearance of electric charges in the material) whereas the actuator function is obtained by inverse piezoelectric effect (in this case an electric polarization external to the material generates a mechanical deformation of said latter).

In order to produce the actuator function, a piezoelectric material having a transversal piezoelectric coefficient of the highest possible coefficient d31 is generally chosen. This is the case of PZT (or doped PZT (La, Mn, Nb), KNN, BNT-BT, or also PMN-PT).

In order to produce the sensor function, a material having the best compromise between a high transversal piezoelectric coefficient e31 and a low dielectric permittivity $\varepsilon_r$, that is to say with the largest Figure of Merit FOM=e31/$\varepsilon_r$, is generally chosen. This is typically the case of AlN (or also Sc-doped AlN).

Figure 6A:
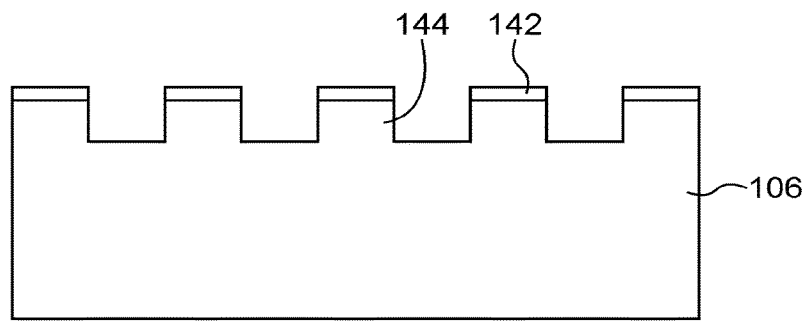
FIGS. 6A to 6C show the steps of a method for transferring at least one layer of material according to a fifth embodiment.
Figure 6B:
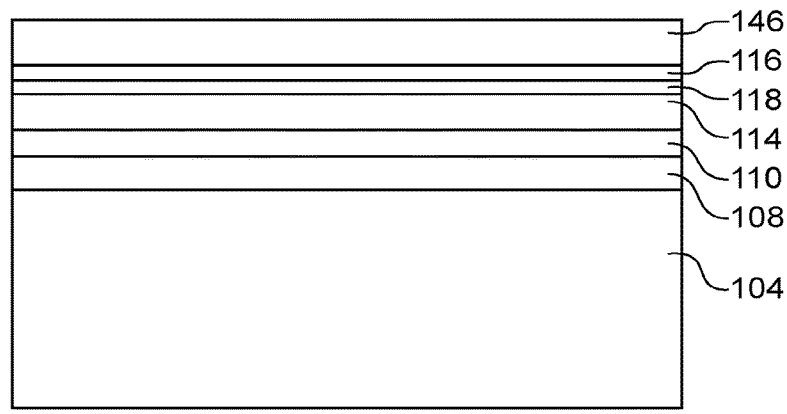

The layer transfer method described here may advantageously apply to produce such an electromechanical transduction structure. A fifth embodiment of the transfer method is described below in relation to FIGS. 6A to 6C, for example for producing a PMUT or an energy recovery system.

The second substrate 106 is first of all prepared to receive the layer or layers to be transferred from the first substrate 104. In the example described here, the first and second substrates 104, 106 are intended to be secured to one another by direct bonding, or molecular bonding. Thus, a first direct bonding layer 142 adapted for such a direct bonding is formed on the face of the second substrate 106 that is located on the side where the layer or layers will be transferred. Cavities 144 are subsequently produced through the first direct bonding layer 142 and a portion of the thickness of the second substrate 106 (see FIG. 6A). Said cavities 144 are intended to be located under the membranes of the electromechanical transduction structures that will subsequently be produced from the layers that will be transferred to the second substrate 106.

The layers to be transferred are produced on the first substrate 104. As in the preceding embodiments, the interface of weak adhesion force is formed by the separating layers 108, 110 whereon are located the layer 114 that includes here a piezoelectric and/or pyroelectric and/or ferroelectric and/or dielectric material, the grip layer 116 comprising for example TiO$_2$, the electrode layer 118 that includes for example platinum and that is intended to form one of the electrodes of the electromagnetic transduction elements (the other electrode being intended to be formed by the second separating layer 110), and a second direct bonding layer 146 adapted for the implementation of a direct bonding with the other direct bonding layer 142.

The direct bonding layers 142, 146 include for example SiO2, or SiN, or Si, and have for example a thickness between approximately 1 nm and 100 μm.

Figure 6C:
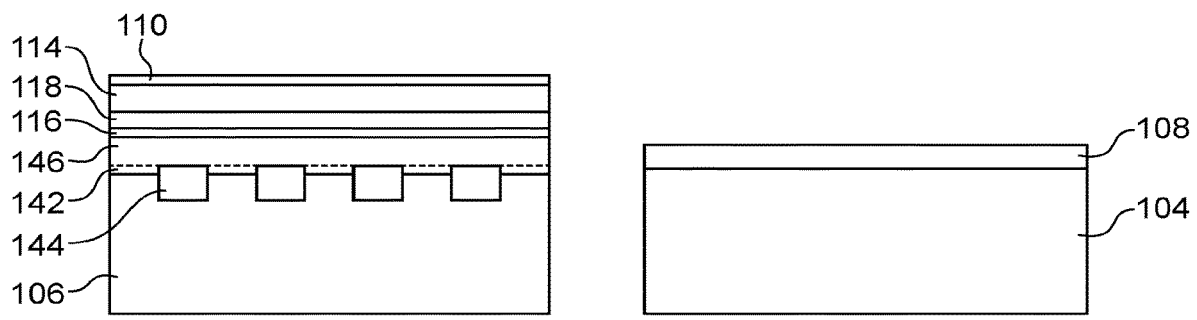

The two substrates 104, 106 are subsequently secured to one another by direct bonding between the direct bonding layers 142, 146, then mechanical separation is performed at the interface of weak adhesion force formed between the separating layers 108, 110. The two separate substrates 104, 106, with the various layers transferred to the second substrate 106, are shown in FIG. 6C. The layers 142, 146 bonded to one another are subsequently used to form the membranes whereon the electromagnetic transduction elements are produced from the layers 114, 110 and 136.

Figure 7A:
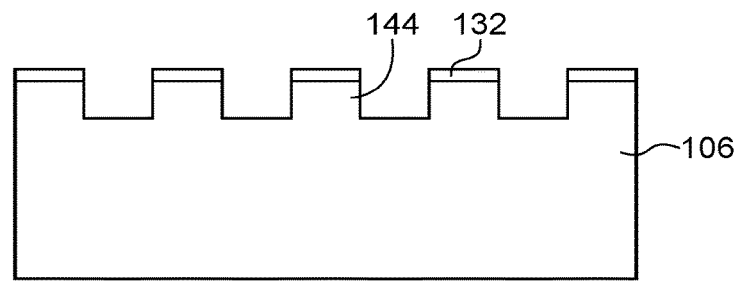
FIGS. 7A to 7C show the steps of a method for transferring at least one layer of material according to one variant of the fifth embodiment.

According to one variant of this fifth embodiment, the securing between the substrates 104, 106 may be obtained by thermocompression by using metal bonding layers 122, 132 between the substrates 104, 106, as previously described in relation to FIGS. 2A-2B and 3A-3C. In this case, it is possible to not produce the electrode layer 118, and the metal bonding layer obtained by the implementation of the thermocompression may be intended to form one of the electrodes of the electromechanical transduction elements. Such a variant is described below in relation to FIGS. 7A to 7C.

The second substrate 106 is first of all prepared to receive the layer or layers to be transferred from the first substrate 104. A metal bonding layer 132 is formed on the face of the second substrate 106 that is located on the side where the layer or layers will be transferred. In the example of embodiment described here, the metal bonding layer 132 includes gold or copper. Cavities 144 are subsequently produced through the first metal bonding layer 132 and a portion of the thickness of the second substrate 106 (see FIG. 7A).

The layers to be transferred are produced on the first substrate 104. As in the preceding embodiments, the interface of weak adhesion force is formed by the separating layers 108, 110. On the example of embodiment shown in FIG. 7B, the first separating layer 108 includes platinum and the second separating layer 110 includes SiO$_2$. In this variant, the second separating layer 110 is not intended to be used as an electrode and has a thickness for example between approximately 1 nm and 20 μm and is intended to form an elastic membrane of the devices produced subsequently from the stack of layers transferred to the second substrate 106. Alternatively, if the devices to be produced are not intended to have elastic membranes, the second separating layer 110 may be etched after the transfer to the second substrate 106.

Figure 7B:
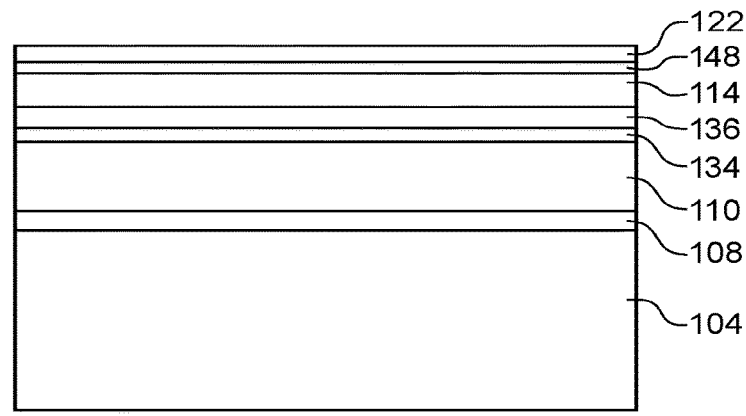

A grip layer 134 comprising for example TiO$_2$ is produced on the second separating layer 110. An electrode layer 136 comprising for example platinum and that is intended to form an electrode of the electromechanical transduction elements subsequently produced is formed on the grip layer 134. The layer 114 of piezoelectric and/or pyroelectric and/or ferroelectric and/or dielectric material, another grip layer 148 (of thickness for example between approximately 5 nm and 10 nm and comprising W and/or TiN and/or Cr and/or Ru) and the other metal bonding layer 122, comprising for example gold or copper, are formed on the electrode layer 136 (FIG. 7B).

Figure 7C:
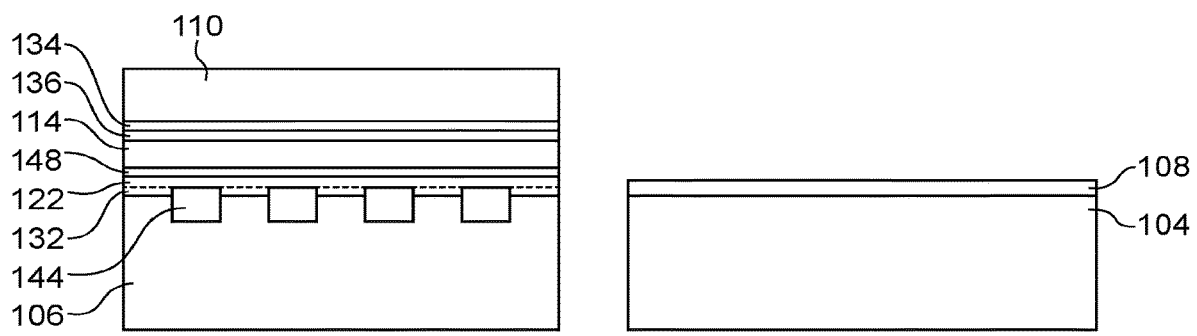

The two substrates 104, 106 are subsequently secured to one another by thermocompression between the metal bonding layers 122, 132, then a separation is performed at the interface of the separating layers 108, 110. The two separate substrates 104, 106, with the various layers transferred to the second substrate 106, are shown in FIG. 7C. The electromechanical transduction elements are subsequently produced from the layers transferred to the second substrate 106. In the structure obtained, the metal bonding layers 122,

132 together form the lower electrode of each of the electromechanical transduction elements.

According to one variant of the example previously described, the second separating layer 110 intended to form part of the membranes of the electromechanical transduction elements may be replaced by a stack comprising the second separating layer 108 (of thickness thinner than in the preceding example), a semiconductor layer, for example silicon, and a semiconductor oxide layer, for example $SiO_2$. Said layers may in particular form a $SiO_2$—Si—$SiO_2$ stack intended to form part of the membranes of the electromechanical transduction elements, and whereof the thicknesses of said layers are chosen to adjust the overall stress of said membranes.

The various examples and variants previously described may apply to the examples of embodiment described above wherein the cavities 144 are produced in the second substrate 106.

Figure 8A:
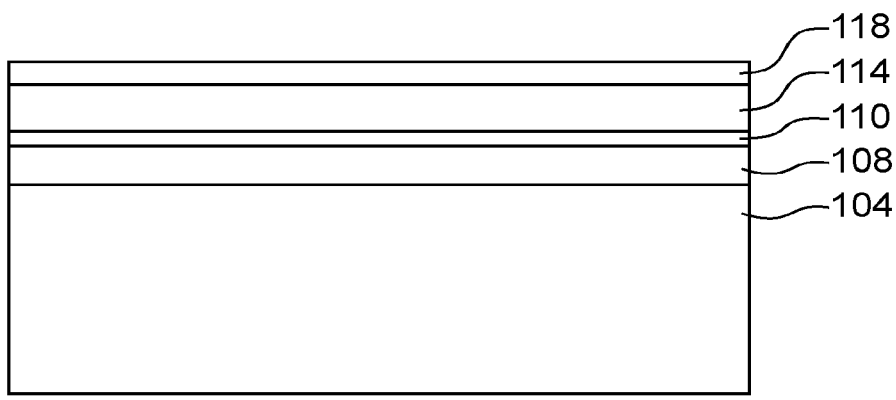
FIGS. 8A to 8C show the steps of a method for transferring at least one layer of material according to a sixth embodiment.

The layer transfer method described here may advantageously apply to produce MIM-type capacitors or capacities. Such a transfer method according to a sixth embodiment is described below in relation to FIGS. 8A to 8C.

The layers to be transferred are produced on the first substrate 104, for example made of silicon. As in the preceding embodiments, the interface of weak adhesion force is formed by the separating layers 108, 110. The first separating layer 108 comprising the $SiO_2$ is disposed between the second separating layer 110 comprising the noble metal, here platinum, and the first substrate 104, so that the second separating layer 110 can be used to subsequently form one of the electrodes of each of the capacities or capacitors that will be produced from the layers transferred to the second substrate 106. The layer 114, that includes here a dielectric material, is produced on the second separating layer 110, then the electrode layer 118 is produced on the layer 114. A wide range of materials is available to form the electrode layer 118, such as for example Pt, Ru, $RuO_2$, Ir, Au, Cu, etc. The layer 114 may include for example a dielectric material or else a piezoelectric and/or ferroelectric and/or pyroelectric material, according to the device intended to be produced (capacitor, transducer, etc.).

Figure 8B:
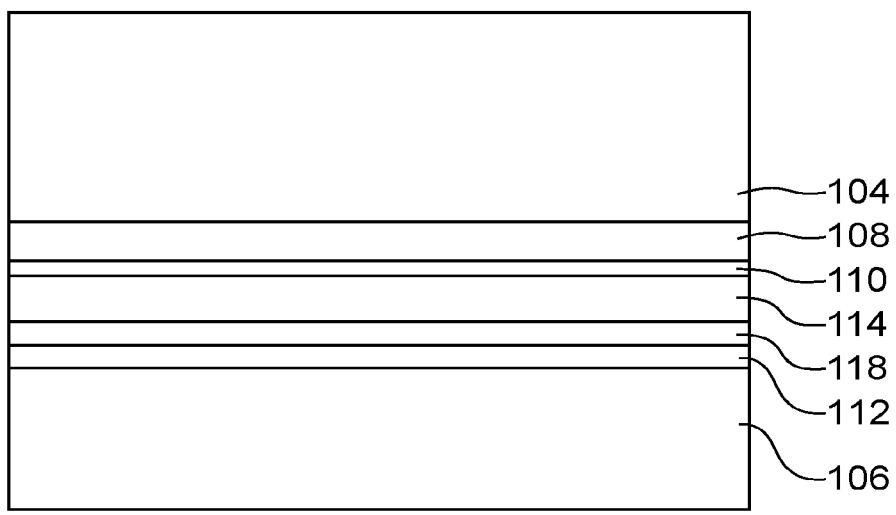

The first substrate 104 and the layers produced thereon are transferred to the second substrate 106 which corresponds here to a substrate including at least one polymer material by means of the adhesive layer 112 (FIG. 8B). A rigid support may be disposed under the second substrate 106 in order to facilitate the implementation of said bonding.

Figure 8C:
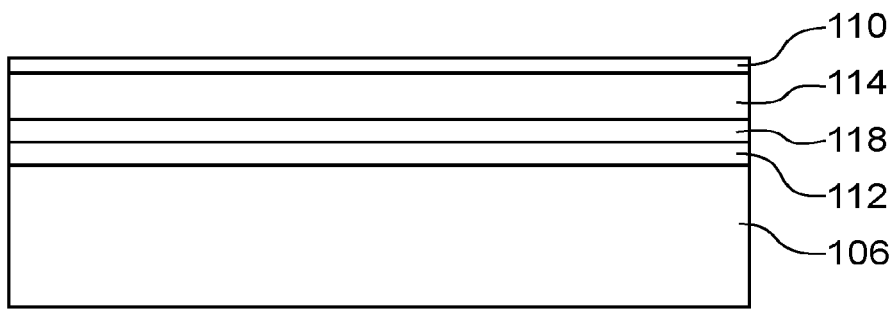

Separation is subsequently performed at the interface of the separating layers 108, 110. The second substrate 106 with the various layers transferred thereon is shown in FIG. 8C.

In this sixth embodiment, the second transfer layer 110 is intended to form the upper electrode of the capacities or capacitors that will be produced from the layers transferred to the second substrate 106. Alternatively, it is possible to etch the second transfer layer 110 in order to replace it with another electrode material deposited on the layer 114.

Such a sixth embodiment may be used to produce capacitors, for example for disconnection, transducers (actuator and/or sensor), vibration energy recovery devices, or also ferroelectric memories.

According to one variant, it is possible to not produce the electrode layer 118. In this case, the layer 114 is disposed directly on the adhesive layer 112. Such a variant is for example implemented in order to produce coplanar capacities, obtained by subsequently etching the upper electrode layer (layer 110) in order to form the electrodes of said capacities that are located on a single face (upper face in FIG. 8C) of the layer 114.

According to one variant, the securing between the first and second substrates 104, 106 may be performed by thermocompression bonding by forming the metal bonding layers 122, 132. In this case, said metal bonding layers 122, 132 may form together one of the electrodes of the capacities produced from the layers transferred to the second substrate 106. A grip layer may be formed on the layer 114 prior to the deposition of the first metal bonding layer 122. Similarly, another grip layer may be produced on the second substrate 106 prior to the deposition of the metal bonding layer 132. Said grip layers may in this case form part of the electrode that will be formed by the metal bonding layers 122, 132.

According to another variant, direct bonding may be implemented between the direct bonding layers 142, 146 as previously described.

Figure 9A:
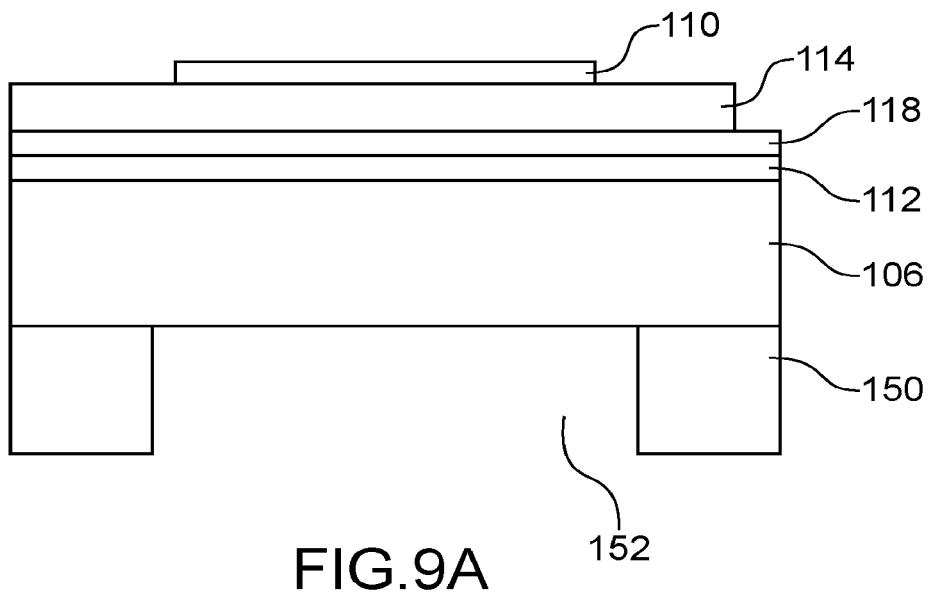
FIGS. 9A and 9B show devices produced from layers transferred by a method for transferring at least one layer of material according to the sixth embodiment.
Figure 9B:
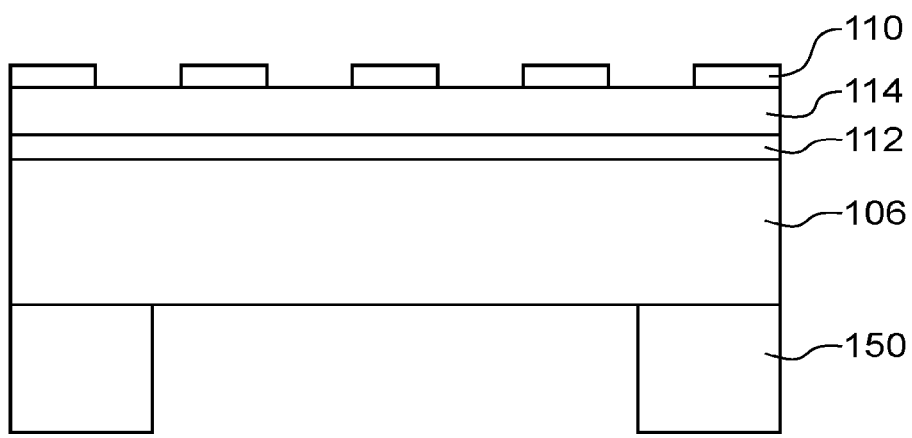

According to another variant, the second substrate 106 may be used as flexible membranes for the devices produced from the layers transferred. In this case, the second substrate 106 is disposed on a mechanical support 150 that may be etched from the rear face thereof in order to release the membrane via the creation of a cavity 152 under the membrane. FIG. 9A shows a MIM capacity of a piezoelectric transducer device wherein the second substrate 106 forms a compliant/flexible membrane of said capacity. FIG. 9B shows a coplanar capacity of such a device wherein the second separating layer 110 is etched such that the remaining portions of said layer form the electrodes of the capacity (in FIG. 9B, no lower electrode is present between the layer 114 and the second substrate 106).

In the embodiments and examples of embodiment described above, a single layer of piezoelectric material 114 is used. Alternatively, the transfer method may be implemented to form on the second substrate 106 the stack of layers including two superimposed piezoelectric layers, one of said two layers advantageously having a piezoelectric material adapted to provide a piezoelectric actuation, that is to say having a transversal piezoelectric coefficient d31 the highest possible, such as for example PZT, or La-doped PZT, Mn or Nb, or KNN, or BNT-BT, or PMN-PT, and the other of said two layers having a piezoelectric material adapted to provide the sensor function, that is to say having the best compromise between a high transversal piezoelectric coefficient e31 and a low dielectric permittivity, such as for example AlN or Sc-doped AlN. For this, each of said piezoelectric layers is produced on one of the two substrates 104, 106.

Indeed, some piezoelectric MEMS/NEMS devices operate both in actuator mode and in sensor mode. This is the case of PMUT (Piezoelectric Micromachined Ultrasonic Transducers). They operate as actuators in order to transmit sound waves (transmission) and as sensors in order to receive the sound waves in return (reception). The PMUT devices integrate the same piezoelectric material that will make possible both the transmission of ultrasonic (US) waves and the reception of US waves in return. The electromagnetic transducers very often include in the form of type of membrane a drumhead, that is to say a membrane (elastic layer+so-called "motor" layer (piezoelectric or other)) suspended above a cavity.

The transfer method proposed here is advantageous because such a stack of two different piezoelectric materials is difficult to obtain with the conventional methods of the prior art, due to technological constraints such as the thermal budget, the diffusion of elements during annealing that require the addition of barrier layers, a delicate crystal growth, the management of mechanical stresses, etc. When two layers of piezoelectric materials are produced, it is not necessary to form a Si, $SiO_2$ or SiN based elastic or mechanical membrane because during actuator operation, the piezoelectric material that is used as a sensor plays the role of elastic membrane and during sensor operation, the piezoelectric material that is used as an actuator plays the role of elastic membrane.

Such a transfer method implemented to provide a stack comprising two layers of piezoelectric materials is described below and in relation to FIGS. 10A to 10F.

Figure 10A:
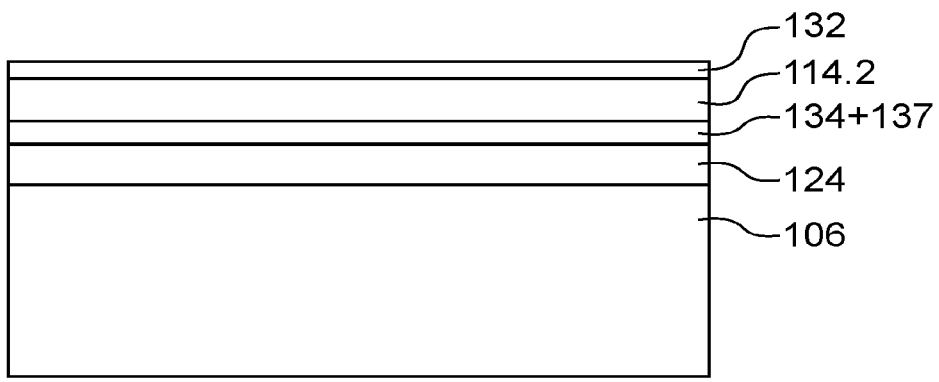
FIGS. 10A to 10F show the steps of a method for transferring at least one layer of material according to a seventh embodiment.

As shown in FIG. 10A, a portion of the stack, corresponding to the actuator portion, is formed on the second substrate 106. Said portion of the stack includes the insulating layer 124, the grip layer 134, the electrode layer 136, the second piezoelectric layer 114.2 that includes for example PZT, and the second metal bonding layer 132.

Figure 10B:
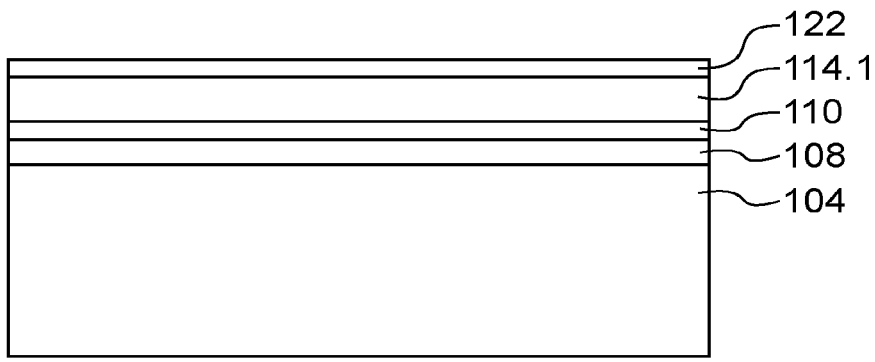

The other portion of the stack, corresponding to the sensor portion, is produced on the first substrate 104. Said other portion of the stack includes the first and second separating layers 108, 110, the first piezoelectric layer 114.1 that includes for example AlN, and the other metal bonding layer 122 (FIG. 10B).

The first and second substrates 104, 106 are secured to one another by a thermocompression bonding implemented between the metal bonding layers 122, 132.

Figure 10C:
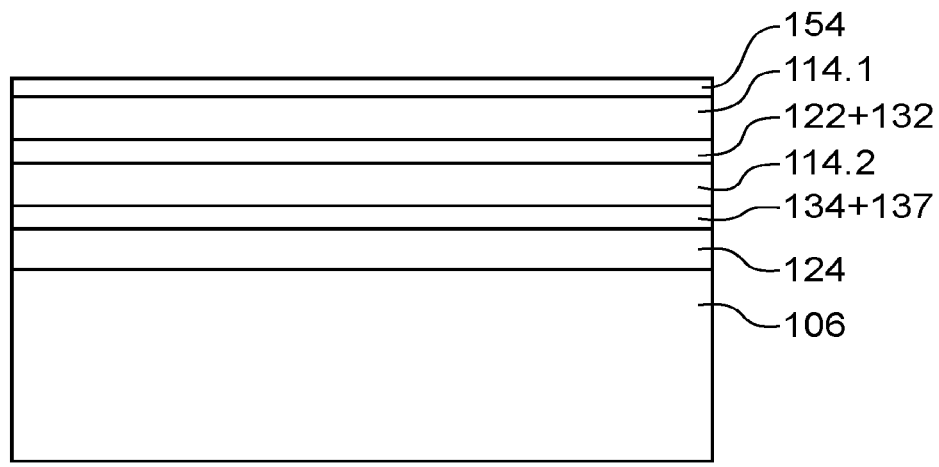

Mechanical separation is subsequently performed between the separating layers 108, 110. The second separating layer 110 remaining on the first piezoelectric layer 114.1 is eliminated, then a new electrode layer 154, comprising for example Mo is formed on the first piezoelectric layer 114.1 (FIG. 10C). In the structure thus obtained, the layers 154 and 136 as well as the metal bonding layers 122, 132 form the electrodes (the metal bonding layers form a common electrode used both by the sensor portion and by the actuator portion of the devices).

Grip layers and/or layers forming diffusion barriers (for blocking for example the diffusion of gold coming from the metal bonding layers) may be disposed between the two metal bonding layers 122, 132 and the piezoelectric material layers 114.1, 114.2.

Figure 10D:
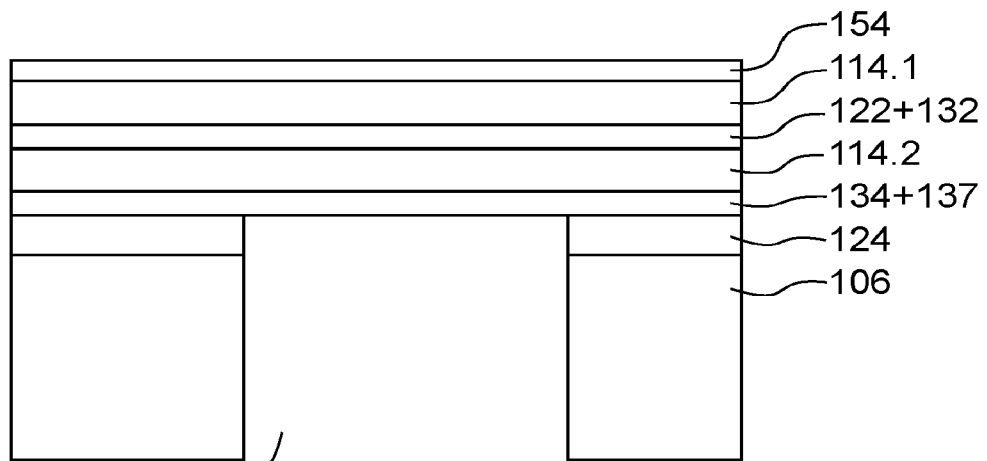
Figure 10E:
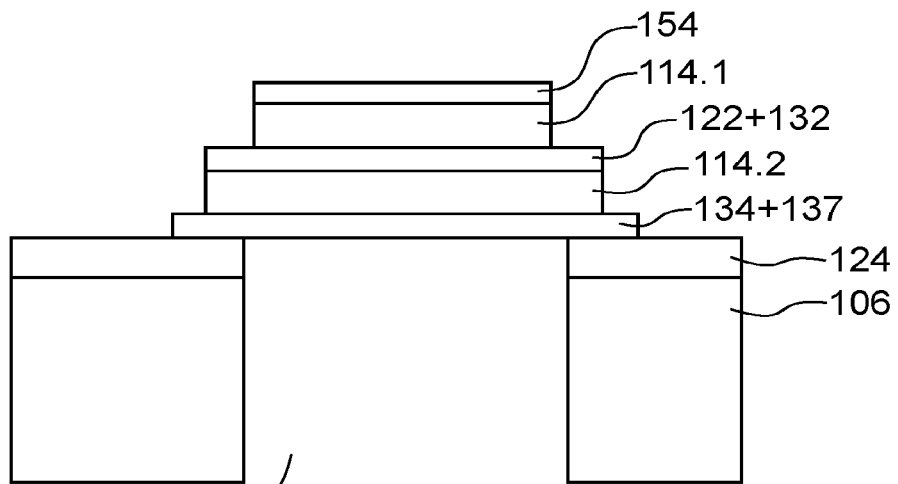

The second substrate 106 and the layer 124 are subsequently etched from the rear face of the second substrate 102, forming the cavities 144 (a single cavity 144 is shown in FIG. 10D) under the portions of the stack intended to form the membranes of the devices. The other layers of the stack are subsequently etched according to the desired configuration for the devices (see FIG. 10E).

Figure 10F:
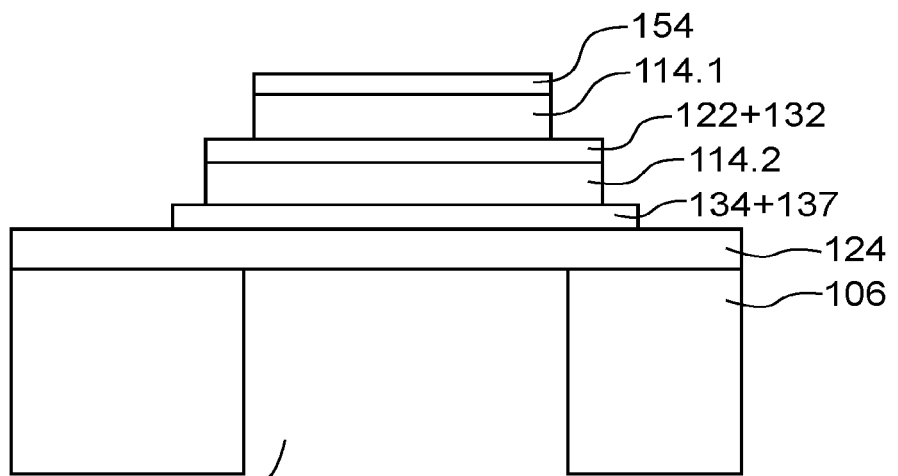

Alternatively, it is possible that the cavities 144 are not formed through the layer 124, as is the case on the example in FIG. 10F. The layer 124 then forms an etching stop layer during the producing of cavities 144 and may also be used as elastic layer of the device(s) subsequently produced.

According to another variant, before the securing of the two substrates 104, 106, the portion of the stack corresponding to the sensor portion (including the piezoelectric layer 114.2) may be produced on the second substrate 106 and the portion of the stack corresponding to the actuator portion (including the piezoelectric layer 114.2) may be produced on the first substrate 104. In this case, the electrode formed between the second substrate 106 and the piezoelectric layer 114.1 may include the molybdenum formed on a growth layer present on the insulating layer 124.

Figure 11:
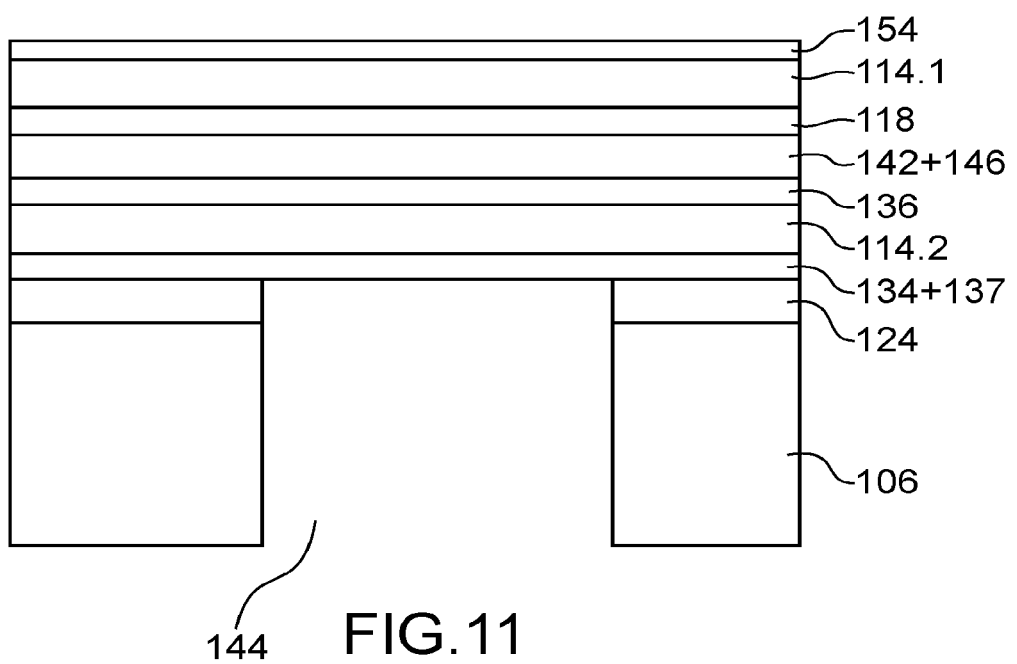
FIG. 11 shows a structure obtained by implementing a method for transferring at least one layer of material according to an eighth embodiment.

According to another variant, the two portions of the stack produced on the two substrates 104, 106 may be secured to one another by means of direct bonding. The stack obtained at the end of such a securing is shown for example in FIG. 11. The layer 142+146 from the direct bonding may be used as elastic layer of the device(s) subsequently produced.

The various examples of embodiment and the various alternative embodiments described may apply for each of the embodiments.

The invention claimed is:

1. A method for transferring at least one layer of material from a first substrate to a second substrate, comprising:
    producing first and second separating layers disposed one against the other on a face of the first substrate, and such that the first separating layer is disposed between the first substrate and the second separating layer;
    producing said at least one layer of material to be transferred on the second separating layer;
    securing said at least one layer of material to be transferred to the second substrate, forming a stack of different materials;
    performing mechanical separation at an interface between the first and second separating layers, such that the first separating layer remains integral with the first substrate and that the second separating layer remains integral with said at least one layer of material to be transferred; and
    between the step of producing first and second separating layers and the step of securing the at least one layer of material, at least one step reducing an initial adhesion force of the interface between the first and second separating layers,
    wherein the materials of the stack are chosen such that the interface between the first and second separating layers corresponds to the interface, of all of the interfaces of the stack, having a weakest adhesion force,
    wherein one of the first and second separating layers includes at least one of $SiO_2$ and silicon nitride and the other of the first and second separating layers includes at least one noble metal, and
    wherein said at least one step reducing the initial adhesion force of the interface between the first and second separating layers includes the implementation of at least one heat treatment at a temperature modifying a stress of the noble metal.

2. The method according to claim 1, wherein the noble metal includes platinum.

3. The method according to claim 1, wherein the step of securing is implemented:
    by means of an adhesive layer produced on said at least one layer of material to be transferred or on the second substrate, or
    by thermocompression between a first metal bonding layer, produced on said at least one layer of material to be transferred, and a second metal bonding layer produced on the second substrate, or
    by direct bonding between a first bonding layer, produced on said at least one layer of material to be transferred, and a second bonding layer produced on the second substrate.

4. The method according to claim 1, wherein said at least one layer of material to be transferred includes at least one layer of at least one material among: a pyroelectric material, a piezoelectric material, a ferroelectric material and a dielectric material.

5. The method according to claim 4, wherein:
    said at least one material includes lead;
    said one of the first and second separating layers includes $SiO_2$;

said at least one step reducing the initial adhesion force of the interface between the first and second separating layers includes the implementation of at least one heat treatment forming, at the interface between the first and second separating layers, an alloy of lead and $SiO_2$ in liquid phase, then of a cooling forming cavities at the interface between the first and second separating layers.

6. The method according to claim 4, wherein said at least one layer of material to be transferred includes at least one first electrode layer such that said at least one layer of at least one material is disposed between the first electrically conductive layer and the second separating layer.

7. The method according to claim 4, wherein the second separating layer includes at least one noble metal.

8. The method according to claim 4, wherein said at least one layer of material to be transferred includes at least one second electrode layer disposed between said at least one layer of at least one material and the second separating layer.

9. The method according to claim 1, wherein said at least one layer of material to be transferred includes at least one first layer of at least one first material among: pyroelectric material, piezoelectric material, ferroelectric material, and dielectric material, and further comprising, before the step of securing, producing at least one second layer of at least one second material among: pyroelectric material, piezoelectric material, ferroelectric material and dielectric material, and of at least one third electrode layer disposed between the second substrate d said at least one second layer of at least one second material.

10. The method according to claim 4, further comprising at least one of the following steps:
   before the step of securing, producing cavities in the second substrate, through a face of the second substrate whereon said at least one layer of material to be transferred is secured;
   after the step of securing, producing cavities in the second substrate, through a face opposite to that whereon said at least one layer of material to be transferred is secured.

11. The method according to claim 1, wherein the second substrate includes at least one polymer material, and wherein the step of securing is implemented at a temperature less than or equal to approximately 150° C.

12. The method according to claim 1, further comprising, after the step of mechanical separation, a step of etching the second separating layer.

13. The method according to claim 1, further including, between the step of producing said at least one layer of material to be transferred and the step of securing said at least one layer of material to be transferred to the second substrate, a step of producing functional MEMS and/or NEMS and/or microelectronic type components from said at least one layer of material to be transferred.

14. The method according to claim 1, wherein, after the step of mechanical separation, the preceding steps of the transfer method are each repeated at least once in order to transfer at least one other layer of material from the first substrate to said at least one layer of material.

15. The method for producing components of at least one of the follow types: MEMS, NEMS and microelectronic, comprising the implementation of a transfer method according to claim 1, then producing components from the second substrate and from said at least one layer of material to be transferred.

16. The method according to claim 15, wherein the components produced are piezoelectric transducers and/or pyroelectric and/or ferroelectric components and/or include MIM and/or coplanar type capacitors, and wherein said at least one layer of material to be transferred includes at least one layer of at least one material among: a pyroelectric material, a piezoelectric material, a ferroelectric material and a dielectric material.

17. A method for transferring at least one layer of material from a first substrate to a second substrate, comprising:
   producing first and second separating layers disposed one against the other on a face of the first substrate, and such that the first separating layer is disposed between the first substrate and the second separating layer;
   producing said at least one layer of material to be transferred on the second separating layer;
   securing said at least one layer of material to be transferred to the second substrate, forming a stack of different materials;
   performing mechanical separation at an interface between the first and second separating layers, such that the first separating layer remains integral with the first substrate and that the second separating layer remains integral with said at least one layer of material to be transferred; and
   between the step of producing first and second separating layers and the step of securing the at least one layer of material, at least one step reducing an initial adhesion force of the interface between the first and second separating layers,
   wherein the materials of the stack are chosen such that the interface between the first and second separating layers corresponds to the interface, of all of the interfaces of the stack, having a weakest adhesion force,
   wherein the at least one layer of material to be transferred includes at least one layer of at least one material among: a pyroelectric material, a piezoelectric material, a ferroelectric material and a dielectric material, and
   wherein the at least one material includes lead, the one of the first and second separating layers includes $SiO_2$, and said at least one step reducing the initial adhesion force of the interface between the first and second separating layers includes the implementation of at least one heat treatment forming, at the interface between the first and second separating layers, an alloy of lead and $SiO_2$ in liquid phase, then of a cooling forming cavities at the interface between the first and second separating layers.

* * * * *